US011778791B2

(12) United States Patent
Gao

(10) Patent No.: US 11,778,791 B2
(45) Date of Patent: Oct. 3, 2023

(54) TWO PHASE CONTAINMENT SYSTEM FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 15 days.

(21) Appl. No.: 17/348,100

(22) Filed: Jun. 15, 2021

(65) Prior Publication Data

US 2022/0400585 A1 Dec. 15, 2022

(51) Int. Cl.
*G06F 1/20* (2006.01)
*H05K 7/20* (2006.01)

(52) U.S. Cl.
CPC ......... *H05K 7/20818* (2013.01); *H05K 7/203* (2013.01); *H05K 7/20318* (2013.01); *H05K 7/20327* (2013.01)

(58) Field of Classification Search
CPC .............. H05K 7/203; H05K 7/20318; H05K 7/20809; H05K 7/20818; H05K 7/20327; H05K 7/20236; H05K 7/20381; H05K 7/20281; H05K 7/208; H05K 7/20309; H05K 7/20263; H05K 7/2029; H05K 5/067; G06F 1/20; G06F 1/206; F28F 2250/08; F28D 15/0266; F28D 15/00
USPC .......... 361/700, 679.53, 699, 704, 689, 701, 361/688; 165/104.33, 80.4, 301, 80.2, 165/287; 257/715, 714
See application file for complete search history.

(56) References Cited

U.S. PATENT DOCUMENTS

| 9,622,379 | B1* | 4/2017 | Campbell | H05K 7/20318 |
|---|---|---|---|---|
| 10,624,237 | B2* | 4/2020 | Enright | H05K 7/20818 |
| 10,727,553 | B1* | 7/2020 | Gao | H05K 7/1489 |
| 10,925,188 | B1* | 2/2021 | Keehn | H05K 7/20318 |
| 2011/0132579 | A1* | 6/2011 | Best | H05K 7/20 165/104.31 |
| 2016/0240226 | A1* | 8/2016 | Shelnutt | H05K 7/203 |
| 2017/0325355 | A1* | 11/2017 | Lau | H05K 7/20318 |
| 2019/0078846 | A1* | 3/2019 | Wan | F28F 9/262 |
| 2019/0357379 | A1* | 11/2019 | Kolar | H05K 7/20827 |
| 2021/0059079 | A1* | 2/2021 | Keehn | H05K 7/20327 |
| 2021/0302088 | A1* | 9/2021 | Shao | F25B 49/02 |

(Continued)

*Primary Examiner* — Mandeep S Buttar
(74) *Attorney, Agent, or Firm* — WOMBLE BOND DICKINSON (US) LLP

(57) ABSTRACT

A two-phase immersion cooling system for cooling electronics. The electronics are immersed in immersion tank filled with dielectric liquid. As liquid evaporates due to heat generated by the electronics, it enters a vapor passageway that leads the vapor to a condenser situated remotely from the immersion tank. Upon condensing at the condenser, the condensed liquid is directed to a resupply tank, wherein the condensed liquid cools. When the level of the dielectric liquid in the immersion tank drops below a set threshold, a pump is activated to deliver the condensed liquid from the resupply tank to the immersion tank. The immersion tank, vapor passageway and condenser are position inside a containment passageway. The containment passageway captures any vapor not entering the vapor passageway and direct such vapor to the condenser. The resupply tank may also be positioned within the containment passageway.

20 Claims, 5 Drawing Sheets

(56) References Cited

U.S. PATENT DOCUMENTS

2022/0110223 A1\* 4/2022 Heydari ............. H05K 7/20836
2023/0156961 A1\* 5/2023 Yuan ..................... H05K 7/203
361/700

\* cited by examiner

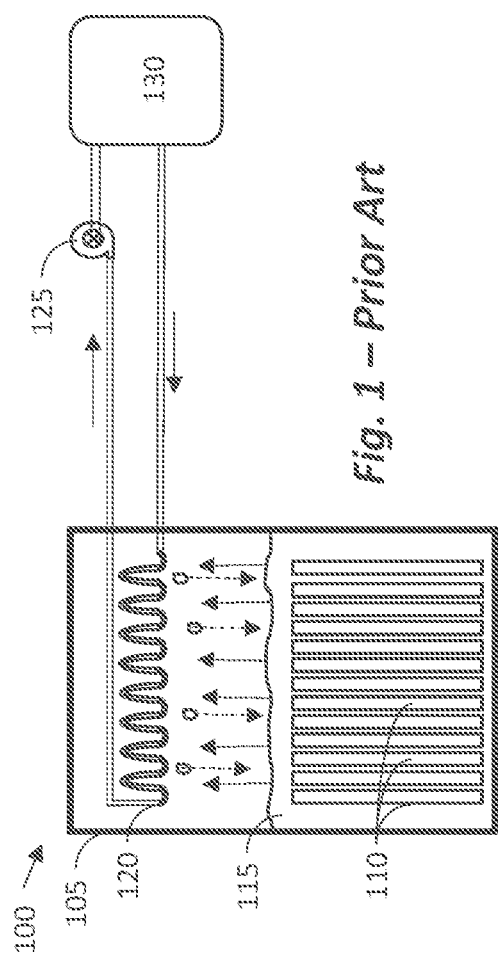
Fig. 1 – Prior Art
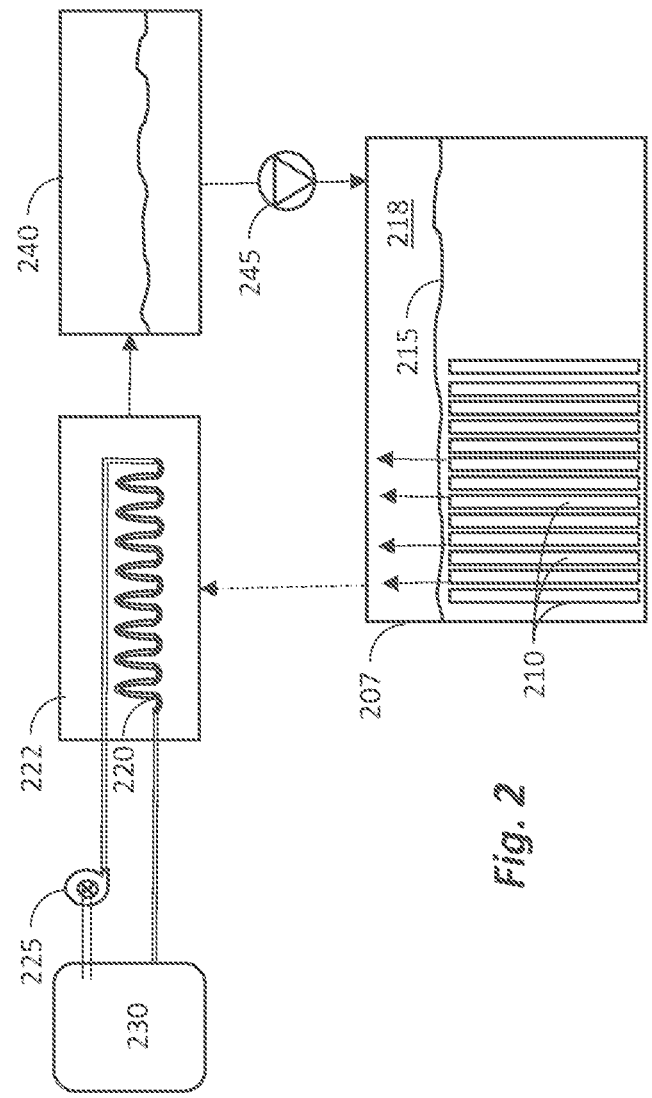
Fig. 2

TWO PHASE CONTAINMENT SYSTEM FOR SERVERS

FIELD OF THE INVENTION

Embodiments of the present invention relate generally to enhanced and reliable cooling of advanced processors and electronics, specifically to improved two-phase immersion cooling for servers.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort need to be taken to ensure proper heat removal from these chips. Recently a method for cooling, generally referred to as two-phase immersion cooling, has been introduced using dielectric liquid. Two-phase immersion cooling is a relatively new type of cooling technology implemented currently for data centers. In a two-phase immersion cooled system the electronic components are submerged directly in a bath of dielectric heat transfer liquid. The dielectric liquid is a specifically developed liquid which is nonconductive and non-corrosive, so that it may come in direct contact with the electronic devices without affecting the circuitry (e.g., shorting) or harming the devices. Additionally, the dielectric liquid is a much better heat conductor than air or water.

Another feature of the dielectric liquid is that it has a low boiling point e.g., a low boiling point which can be similar or less than the designed operational temperatures of the electronic devices. Consequently, the dielectric liquid boils when contacting the surface of heat generating devices, and the vapors rise naturally towards a condenser. Upon reaching the cold condenser the vapor condenses and releases the heat it removed from the device upon vaporizing. The cyclical two-phase change between liquid and vapor efficiently removes heat generated by operating devices. One benefit of this natural boiling and rising of the vapor is that it causes passive circulation, thus negating the need for pumps to circulate the dielectric liquid.

While two-phase immersion cooling seems to provide the required thermal performance and reliability, since data centers may have thousands of chips requiring cooling, the cost of the cooling system and its maintenance must remain acceptable. However, the dielectric cooling liquid is generally proprietary and is very expensive. With the current design of two-phase immersion systems there's an unacceptable loss of the dielectric liquid in the form of escaping vapor, which drastically raises the cost of maintaining the system and may also lead to unacceptable temperature rise if the dielectric liquid is not timely replenished.

BRIEF DESCRIPTION OF THE DRAWINGS

Embodiments of the invention are illustrated by way of example and not limitation in the figures of the accompanying drawings in which like references indicate similar elements.

FIG. 1 is a block diagram illustrating an example of a two-phase immersion system according to the prior art.

FIG. 2 is a schematic illustrating a two-phase immersion system according to an embodiment.

FIG. 4 illustrates another embodiment of a two-phase immersion system in a computing facility, showing a cluster implementation, while

DETAILED DESCRIPTION

Figure 3:
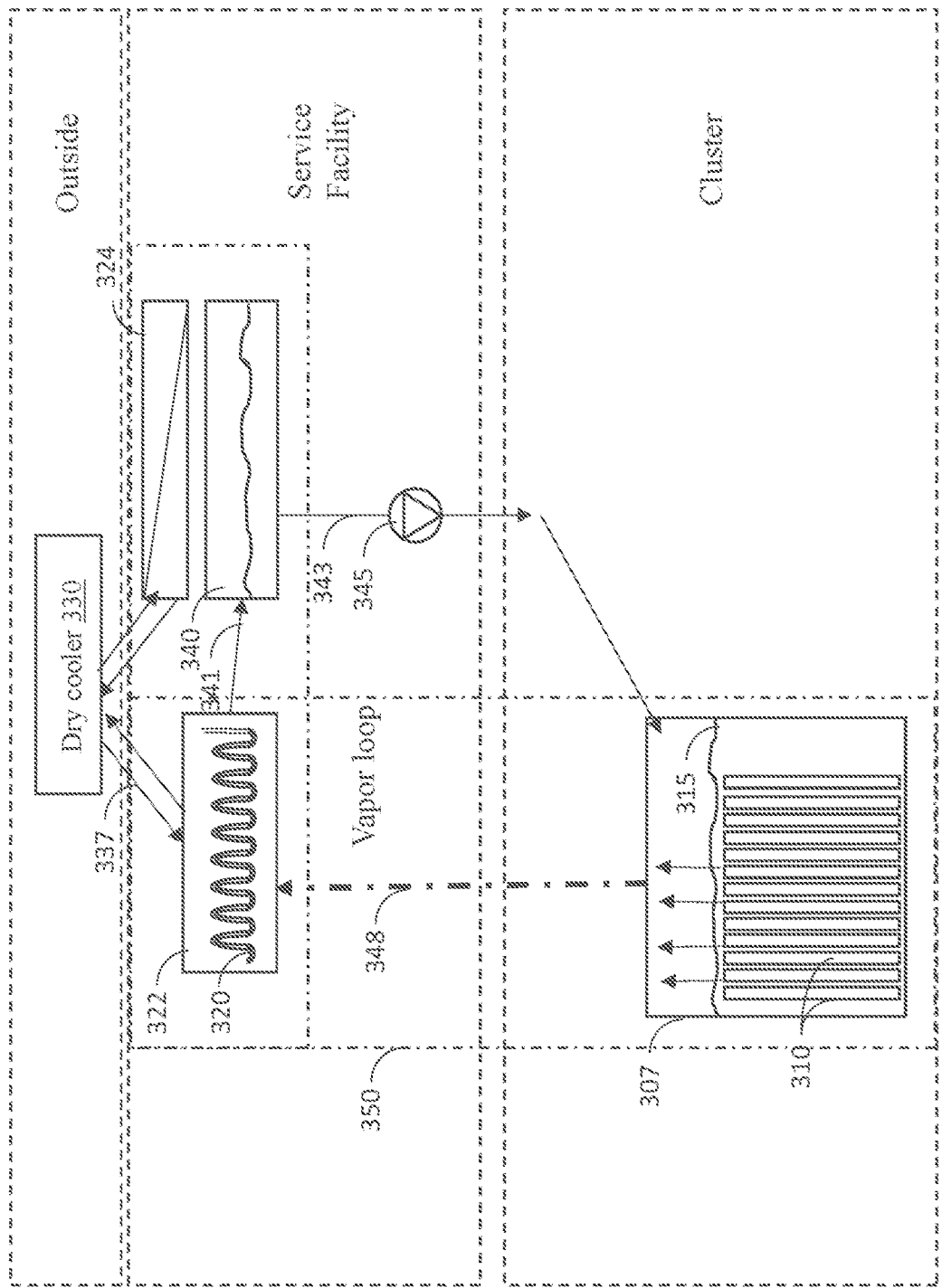
FIG. 3 illustrates an embodiment of a two-phase immersion system in a computing facility.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x ##, wherein the first digit x is replaced by the same digit as the figure number, while the next two digits ## are maintained consistent among the embodiments. Consequently, explanation of previously disclosed elements may not be repeated in subsequent embodiments.

FIG. 1 is a general diagram of a conventional two-phase immersion cooling system 100. The system includes a sealed enclosure 105 housing a plurality of servers 110 (generally in the form of exposed PCB boards), which are immersed in dielectric liquid pool 115. As devices within servers 110 operate and generate heat, liquid contacting these devices evaporate and the vapor rises as shown by the dotted arrows. As the vapor rises it comes in contact with condenser 120 and condenses back to liquid and returns down to the liquid pool 115, as illustrated by the dashed arrows. Meanwhile, the condenser 120 is kept cool by action of pump 125 and chiller unit 130.

As experience has shown, in operation part of the vapor escapes the enclosure 105 and is lost to the ambient atmosphere. Consequently, the dielectric cooling pool 115 needs to be replenished periodically. Failing to replenish the pool may lead to unacceptable temperature rise in the servers. Moreover, each time the enclosure 105 needs to be opened, e.g., to replenish the pool 115, to service the servers 110, to add or replace servers 110, a certain amount of vapor escapes the enclosure 105, and the longer the enclosure remains open the more vapor escapes, which requires further replenishment of the pool 115. However, as noted, the dielectric cooling liquid is very expensive, so each time the pool needs to be replenished it adds substantial amount to the maintenance cost of the cooling system, which counters the savings gained by not requiring mechanical circulation of the cooling liquid.

The following embodiments provide a two-phase immersion system which avoids the loss of vapor encountered in the prior art. The disclosed embodiments enable maintenance operations of the servers without the worry of escaping vapor. As will be explained in further details below, disclosed embodiments provide an immersion cooling for microchips, processors and electronics, generally having two sections: a cluster section wherein servers are immersed in dielectric liquid inside immersion tanks, and a facilities section wherein vapor from the cluster section is condensed and stored in a resupply tank. The cooled liquid from the resupply tank is delivered to the immersion tank as needed to maintain desired level of dielectric liquid. The vapor from the immersion tank is transported to the facilities section in one of two ways. During normal operation the vapor travels from the immersion tank to the condenser inside a dedicated vapor passageway; however, during maintenance of the servers the vapor travels inside a containment passageway. In some embodiments the dedicated vapor passageway leads to a main condenser, while the containment passageway leads to an auxiliary condenser. The condensed fluid from both the main condenser and the auxiliary condenser can be stored in the same resupply tank, wherein the condensed liquid may further cool down until it is delivered to the immersion tank. Also, in some embodiments the vapor passageway is positioned within the containment passageway, such that any vapor not entering the vapor passageway is captured within the containment passageway.

FIG. 2 is an illustration conceptually showing the general architecture of a two-phase immersion cooling system according to an embodiment. In this approach the enclosure 207 houses the servers 210 immersed in two phase immersion liquid 215 inside the immersion tank 218. As devices within servers 210 operate and generate heat, liquid contacting these devices evaporate and the vapor rises as shown by the dotted arrows. However, in this embodiment the enclosure 207 does not contain a condenser. Rather, the vapor is directed to a condensation facility 222 which includes the condenser 220, as illustrated by the dash-dot arrow. So, while the enclosure 207 does maintain a two-phase environment (in the form of the dielectric liquid 215 and vapor rising therefrom), the vapor is not condensed within the enclosure 207 but is rather transported to a condenser situated external to the enclosure 207. When the vapor is condensed by condenser 220, the condensed liquid is directed to a resupply pool or tank 240, as illustrated by the solid arrow. As needed, liquid from resupply pool 240 is delivered to the immersion tank 218 by, e.g., operation of pump 245.

Thus, in disclosed embodiments, the transition from liquid to vapor occurs within the enclosure 207, but the transition from vapor to liquid occurs exterior to, and remotely from, the enclosure 207. The transition from liquid to vapor transfers heat from the processors and electronics to the vapor, which then transports the heat out of the enclosure 207. In the condenser, the transition from vapor back to liquid deposits the heat carried away from the enclosure 207 onto the coolant flowing within the condenser. The coolant flowing within the condenser then transports the heat to the dry cooler or other external cooling unit, which may be outside of the building and release the heat to the ambient atmospheric environment.

Moreover, the resupply pool also functions as a cooling pool. That is, as the vapor condenses by the condenser 220, the condensed liquid is still of relatively high temperature. So in the prior art, the hot liquid returns immediately directly to the immersion tank. However, as illustrated in FIG. 2, and will be shown in other embodiments disclosed herein, the condensed vapor is not returned directly to the pool 215 as in the prior art. Rather, the condensed liquid is delivered to the resupply pool 240 before it is resupplied to the pool 215.

FIG. 3 is an illustration showing the general architecture of a two-phase immersion cooling system arranged in different sections of a server facility, according to an embodiment. A feature of this embodiment is that it employs a vapor containment enclosure 350, indicated by the dash-dot rectangles. The vapor containment enclosure 350 prevents vapor from escaping beyond the area defined by containment enclosure 350 and is designed to direct vapor towards the condenser 320, auxiliary condenser 324, or both. This can be done by, e.g., dedicated ducting arrangement, walls sealing off the area exterior to the enclosure 307 and the condensers 320 and 324, etc. Once the vapor condenses it does not flow back to the pool 315 as in the prior art, but is rather directed into a resupply pool 340, which may also be within the containment enclosure 350. The containment enclosure 350 represents the concept of containing a dedicated path for the vapor to the dedicated locations where the condensing units are located.

As illustrated conceptually in FIG. 3, vapor rising from the pool 315 may travel in either vapor passageway 348 or within the containment enclosure 350. During normal operation of the servers, the vapor is delivered to the condenser 320 via the dedicated vapor transport passageway 348, e.g., dedicated ducts. This is shown conceptually by the dash-dot arrow marked 348. However, during operations such as, e.g., service of servers 310, any vapors not transported within the dedicated vapor transport passageway 348 are contained within the containment enclosure 350 and rise towards the condenser 320 and/or auxiliary condenser 324. Thus, in one embodiment a first vapor transport mechanism, i.e., passageway 348, is contained within a second vapor transport mechanism 350, which is defined by the vapor containment enclosure 350

Another feature shown in FIG. 3, but which may be implemented in any other embodiment, is the provision of an auxiliary condenser 324 provided above the resupply pool 324, to condense any vapor delivered by the containment enclosure 350, e.g., during server maintenance, into the resupply pool 340. Thus, any errant vapor that does not travel within the vapor passageway 348, would captured within the containment enclosure 350 and condensed by the auxiliary condenser 324. Note that in this embodiment the locations of the auxiliary condenser 324 is higher than the position of the main condenser 320, so as to better capture the vapor from within the containment enclosure 350.

FIG. 3 also illustrates the particular placement of the various elements of the immersion system of this embodiment. Specifically, the immersion tank with liquid pool 315 is positioned within the server cluster area. The cluster area is the area where all the servers are housed and operate—it's a clean and highly secured area. The condenser 320, auxiliary condenser 324, and resupply pool 340 are hosed within the area of the service facilities which is physically separated from the cluster area. For example, the service facilities area may be located above the ceiling of the cluster area, but still within the building. Conversely, the dry cooler 330, e.g., a chiller or evaporative cooler, may be placed outside the building, e.g., on the roof of the building. The dry cooler 330 supplies cold fluid to the condenser 320 and auxiliary condenser 324. The pump 345 for providing dielectric liquid from the resupply pool 340 to the pool 315 may also be plated in the facilities area.

Incidentally, FIG. 3 also indicates the inlet conduit 341 of the resupply tank 340, for receiving condensed liquid from the condenser, and the outlet conduit 343 for delivering the condensed liquid to the immersion tank. Chiller conduits 337 exchange chiller liquid between the dry cooler and the condenser 320 and auxiliary condenser 324. Also, the auxiliary condenser 342 is positioned directly above the resupply tank 340, such that condensed liquid drips directly into the resupply tank 340.

Figure 4:
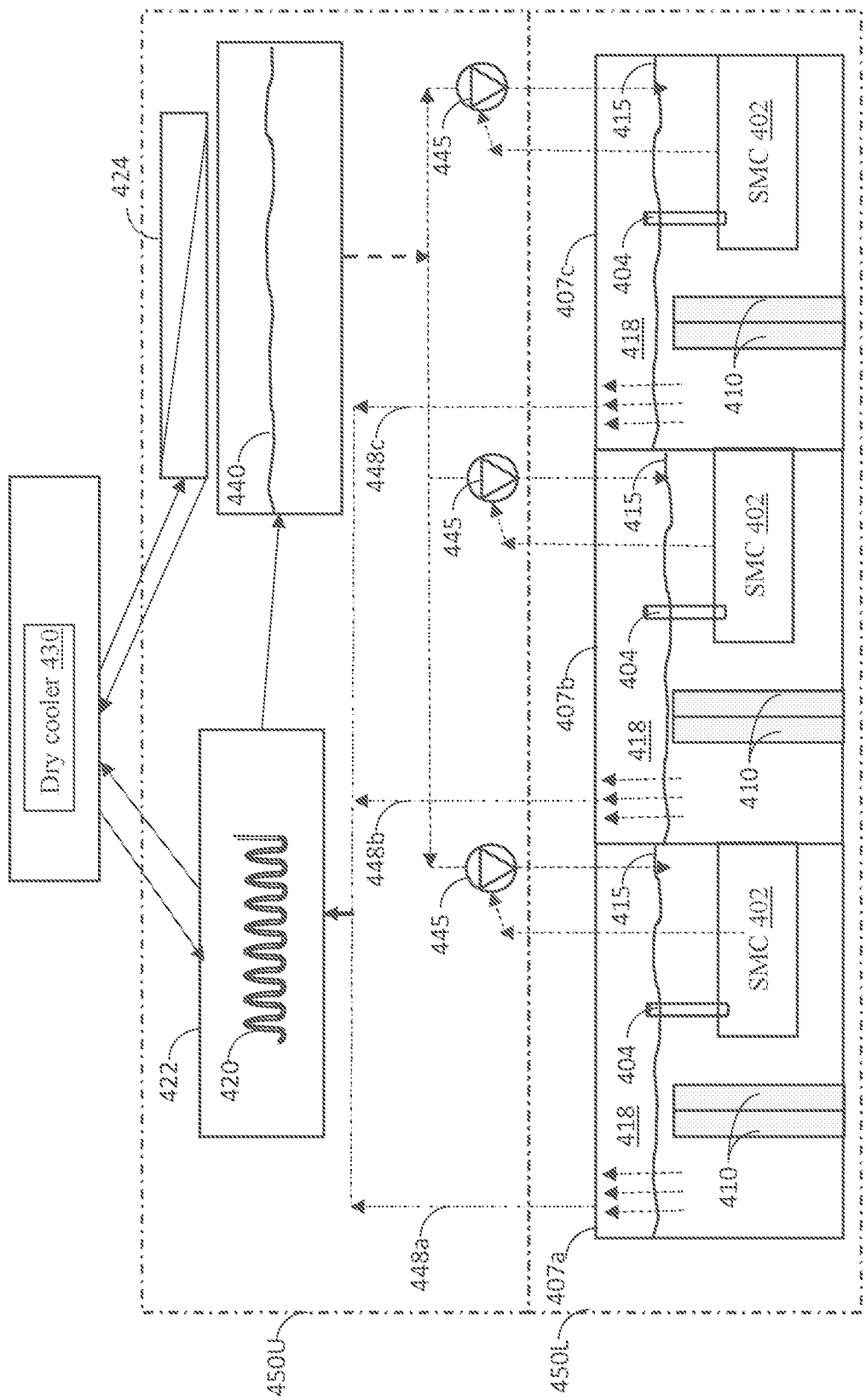

FIG. 4 illustrates an embodiment for a two-phase immersion cooling at a cluster level design. In this embodiment the containment region is delineated by a lower containment enclosure 450L, where the immersion systems with the servers are located, and an upper containment enclosure 450U, where the condenser 420 and the liquid resupply units are located. The lower containment enclosure 450L and upper containment enclosure 450U are sealed to the exterior, but have fluid communication there-between, such that vapor can travel from the lower containment enclosure 450L to the upper containment enclosure 450U, but cannot escape beyond the two containment enclosures. The cluster includes several enclosures 407a-407c, each having liquid pool 415 and a plurality of servers 410 immersed in dielectric liquid in immersion tank 418.

During normal operation, the vapor from each of the liquid pools 415 travels via its dedicated passageway 448a-448c to the condenser facility 422, as illustrated by the dash-dot arrows. Once condensed into liquid, the condensed liquid is transported to a common resupply pool 440. Liquid from the common resupply pool 440 is supplied to any of the liquid pools 415 via dedicated pump 445, according to signals from a system management controller, SMC 402. Conversely, upon opening any of the enclosures 407a-407c, any escaping vapor would be contained by the lower containment enclosure 450L and be directed towards the upper containment enclosure 450U where it would be condensed by condenser 420, auxiliary condenser 424, or both. Any errant vapor would be condensed by auxiliary condenser 424 and be delivered to the resupply pool 440. During either modes of operations, the SMC 402 may monitor the system's power consumption, the signal from a liquid level sensor 404, or both to control the delivery of liquid resupplied from the resupply pool 440 to each individual liquid pool 415. Notably, during service mode the system may be shut off, so that no power is supplied and the only indication for required resupply of liquid can be obtained from the liquid level sensor 404.

Figure 4A:
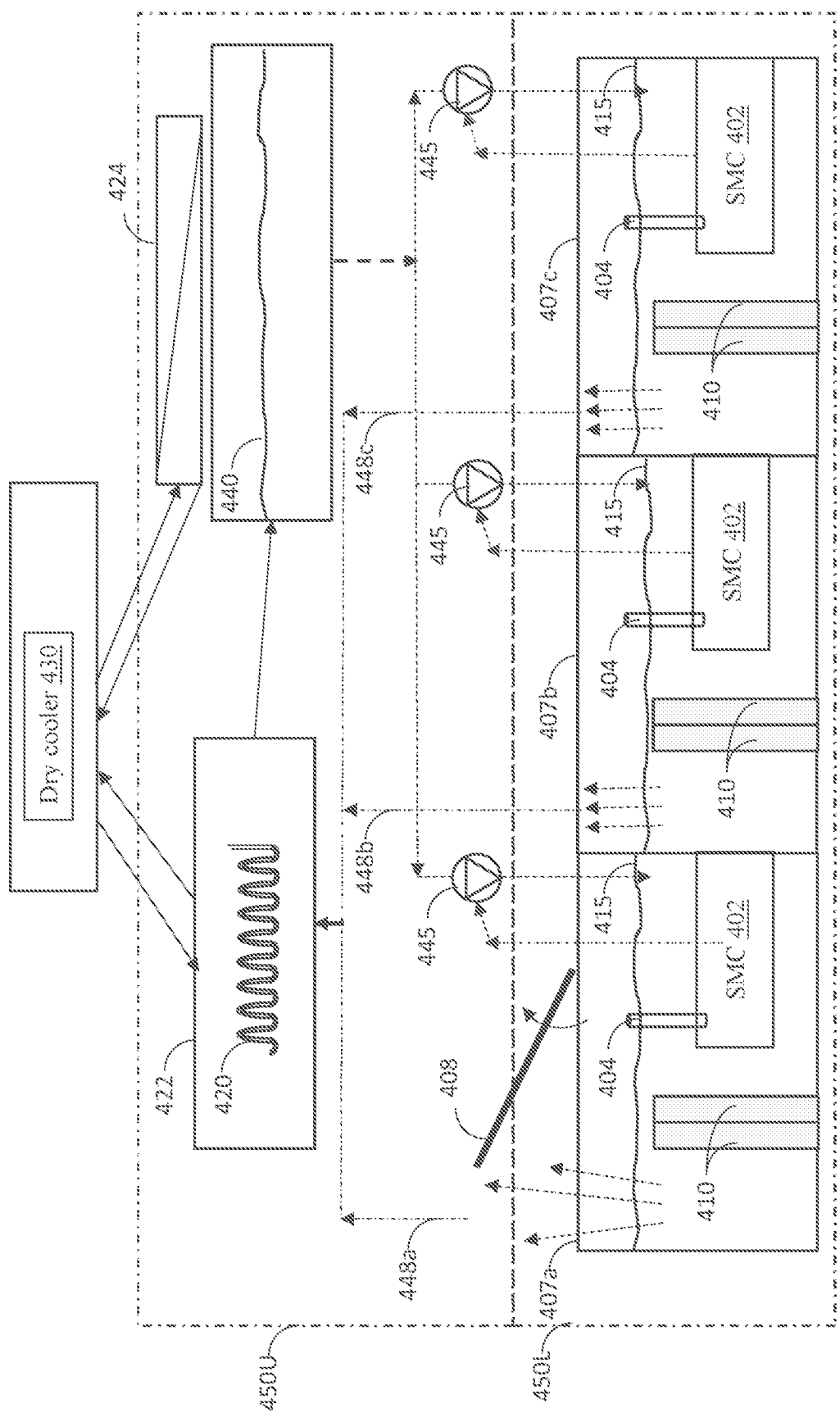
FIG. 4A illustrates the embodiment of FIG. 4 wherein server in one of the immersion tanks undergo maintenance.

FIG. 4A illustrates the condition wherein the lid 408 of enclosure 407a is opened, e.g., for maintenance of servers 410 therein, such that vapor is not transported by the vapor passageway 448a, as illustrated conceptually by the shortened arrow 448a. The other two enclosures 407b and 407c operate normally and vapor from these enclosures still travels via vapor passageway 448b and 448c, respectively. Since the connection to vapor passageway 448a has been disrupted, vapor escapes enclosure 407a, as illustrated by the triple diverging arrows. However, the escaping vapor is contained within the lower containment enclosure 450L and is directed towards the upper containment enclosure 450U, where it is condensed by either condenser 420 auxiliary condenser 424, or both, and the condensed liquid is delivered to the resupply pool 440.

Figure 5:
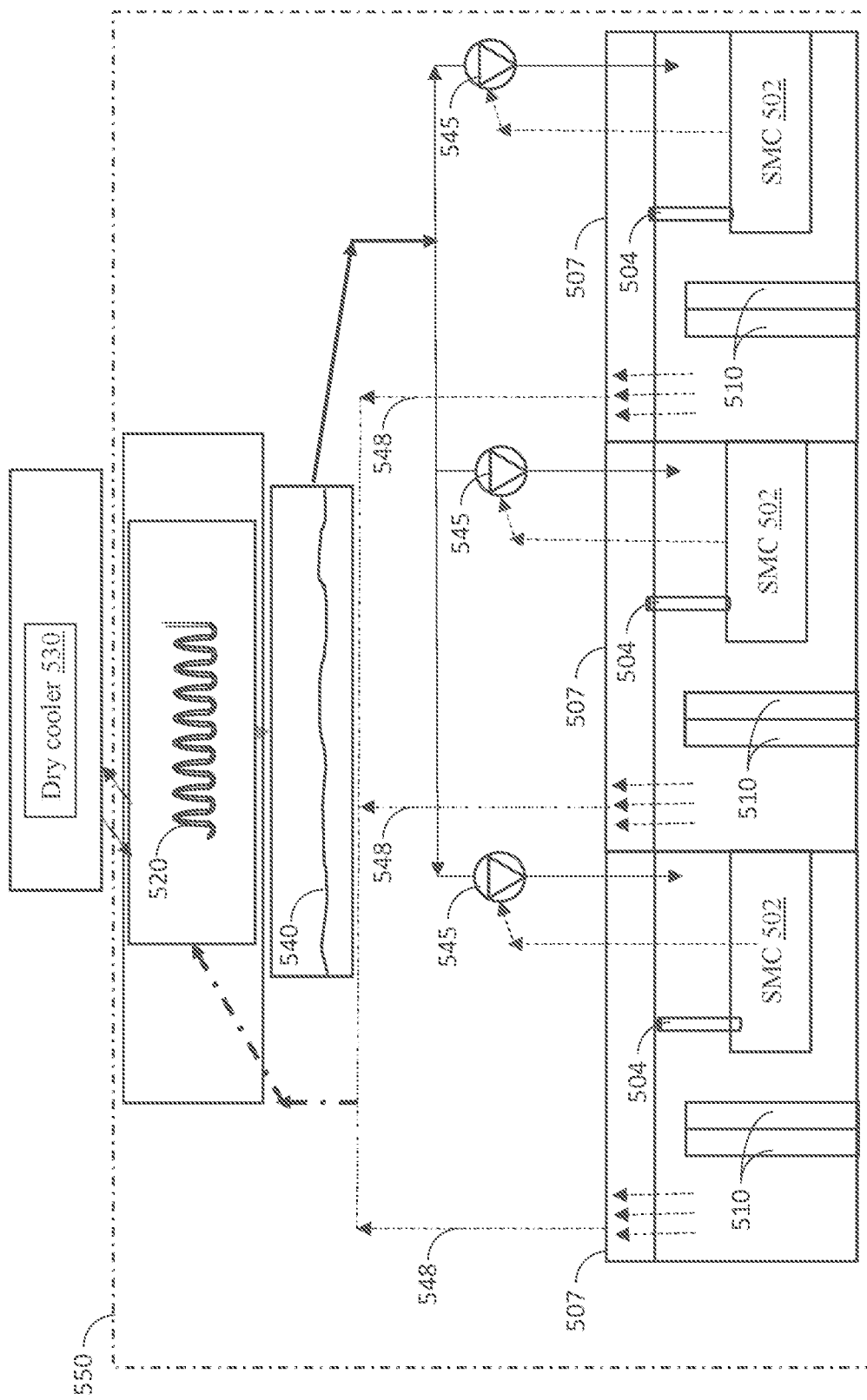
FIG. 5 illustrates yet another embodiment of a two-phase immersion system in a cluster implementation.

FIG. 5 illustrates another embodiment of a cluster level two-phase immersion cooling system. The embodiment of FIG. 5 is very similar to that of FIG. 4, except that in FIG. 5 the auxiliary condenser has been eliminated. Instead, the main condenser 520 is positioned above the resupply pool 540, such that the condensed liquid can be delivered directly to the resupply pool 540. As illustrated, the condenser 520 condenses vapor delivered either by the dedicated vapor passageway 548 (during normal operation) or vapor that is contained by the vapor containment enclosure 550 (either during maintenance or vapor escaping from the enclosure 507 or vapor passageway 548).

As shown, disclosed embodiments provide an immersion cooling for processors and electronics wherein the transition from liquid to vapor occurs in the immersion tank, but then the vapor is transported outside of the immersion tank and the transition from vapor to liquid occurs remotely from the immersion tank. Also, following the condensation of the vapor, the condensed liquid is diverted into a resupply pool and is provided with an opportunity to cool before it is resupplied to the immersion tank.

Thus, in disclosed embodiments the immersion cooling system includes a processing section having at least one immersion tank with servers immersed in dielectric liquid inside the immersion tank, and a vapor transport mechanism transporting vapor from the immersion tank to a recirculation section wherein vapor from the processing section is condensed by a condenser, and the condensed liquid is delivered to a resupply tank. A liquid delivery arrangement is provided to deliver condensed liquid from the resupply tank to the immersion tank. A system management controller may control the delivery of liquid from the resupply liquid tank to the immersion tank as needed to maintain desired level of dielectric liquid. As noted, the vapor from the immersion tank is transported to the recirculation section in one of two ways. During normal operation the vapor travels from the immersion tank to the condenser inside a dedicated vapor passageway. Conversely, during maintenance of the servers in the immersion tank the vapor travels inside a containment passageway. In some embodiments the dedicated vapor passageway leads to a main condenser, while the containment passageway leads to an auxiliary condenser. The condensed fluid from both the main condenser and the auxiliary condenser can be stored in the same resupply tank, wherein the condensed liquid may further cool down until it is delivered to the immersion tank.

According to disclosed aspects, an immersion cooling system for cooling servers is provided, comprising: an immersion enclosure having immersion tank configured for immersing a plurality of servers in dielectric liquid; a condenser arrangement situated remotely from the immersion enclosure; a vapor passageway configured for transporting vapor from the immersion enclosure to the condenser arrangement; and a resupply tank having inlet conduit for receiving condensed liquid from the condenser arrangement and outlet conduit for delivering the condensed liquid to the immersion tank.

According to further disclosed aspects, a method is provided for cooling processors and electronics using dielectric liquid immersion, comprising: providing an immersion tank with dielectric liquid and immersing the processors and electronics in the dielectric liquid; applying power to the processors and electronics to operate the microchips; removing vapor emanating from the immersion tank and directing the vapor to a condenser; collecting condensed liquid from the condenser and delivering the condensed fluid to a resupply tank; and, monitoring the level of the dielectric liquid and when necessary adding liquid to the immersion tank from the resupply tank.

In yet further aspects, a computing facility is disclosed, comprising: a cluster section having a plurality of immersion tanks positioned therein, each of the plurality of immersion tanks having a plurality of computing boards immersed in dielectric liquid within the immersion tank; a facilities section having a condenser arrangement and a resupply tank positioned therein; a plurality of vapor passageways, each providing fluid communication between a respective immersion tank and the condenser arrangement; and a containment passageway enclosing the plurality of immersion tanks, the condenser arrangement and the plurality of vapor passageways, the containment passageway providing fluid communication between the plurality of immersion tanks and the condenser arrangement and containing flow of vapor from the plurality of immersion tanks from flowing outside of the containment passageway.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system for cooling servers, comprising:
    an immersion enclosure having an immersion tank configured for immersing a plurality of servers in dielectric liquid;
    a condenser arrangement situated remotely from the immersion enclosure, the condenser arrangement including a main condenser and an auxiliary condenser;
    a vapor passageway configured for transporting vapor from the immersion tank to the main condenser of the condenser arrangement without transporting vapor from the immersion tank to the auxiliary condenser;
    a containment passageway configured for transporting vapor from the immersion tank to the auxiliary condenser of the condenser arrangement independent of the vapor passageway; and
    a resupply tank for receiving condensed liquid from the main condenser and the auxiliary condenser, the resupply tank having an inlet conduit for receiving condensed liquid from the main condenser and an outlet conduit for delivering the condensed liquid to the immersion tank.

2. The cooling system of claim 1, wherein the vapor passageway is positioned within the containment passageway.

3. The cooling system of claim 1, wherein the containment passageway is fluidly connected between the immersion tank, the main condenser, and the auxiliary condenser.

4. The cooling system of claim 1, wherein the auxiliary condenser is positioned directly above the resupply tank, such that condensed fluid drops directly into the resupply tank.

5. The cooling system of claim 1, wherein the main condenser and the auxiliary condenser are coupled to a dry cooler.

6. The cooling system of claim 1, further comprising a pump coupled to the outlet conduit.

7. The cooling system of claim 6, further comprising a controller controlling operation of the pump to deliver liquid from the resupply tank to the immersion tank.

8. The cooling system of claim 7, further comprising a level sensor providing immersion liquid level indication to the controller.

9. The cooling system of claim 1, wherein the vapor passageway is positioned on top of the immersion tank.

10. The cooling system of claim 1, wherein the immersion tank includes a lid configurable between an open position and a closed position and the vapor passageway comprises ducting from the lid of the immersion tank to the main condenser.

11. The cooling system of claim 10, wherein the vapor passageway is configured for transporting vapor from the immersion tank to the main condenser of the condenser arrangement when the lid of the immersion tank is in the closed position.

12. The cooling system of claim 10, wherein the containment passageway is configured for transporting vapor from the immersion tank to the auxiliary condenser of the condenser arrangement when the lid of the immersion tank is in the open position.

13. The cooling system of claim 10, wherein the containment passageway is configured for transporting vapor from the immersion tank to the main condenser when the lid of the immersion tank is in the open position.

14. A method for cooling electronic devices using dielectric liquid immersion, comprising:
    providing an immersion tank with dielectric liquid and immersing the electronic devices in the dielectric liquid;
    applying power to microchips to operate the electronic devices;
    removing vapor emanating from the immersion tank and directing a first portion of the vapor to a main condenser of a condenser arrangement and a second portion of the vapor to an auxiliary condenser of the condenser arrangement, the first portion of the vapor directed to the main condenser via a vapor passageway, and the second portion of the vapor directed to the auxiliary condenser via a containment passageway, wherein the vapor passageway is configured for directing vapor from the immersion tank to the main condenser without directing vapor from the immersion tank to the auxiliary condenser and the containment passageway is configured for transporting vapor from the immersion tank to the auxiliary condenser of the condenser arrangement independent of the vapor passageway;
    collecting condensed liquid from the main condenser and the auxiliary condenser and delivering the condensed liquid to a resupply tank; and
    monitoring the level of the dielectric liquid in the immersion tank and when necessary adding liquid to the immersion tank from the resupply tank.

15. The method of claim 14, wherein the vapor passageway is located inside of the containment passageway.

16. The method of claim 14, wherein directing the first portion of the vapor to the condenser arrangement comprises during normal operation of the microchips transporting the first portion of the vapor to the main condenser via the vapor passageway and during maintenance of the microchips transporting the second portion of the vapor to the auxiliary condenser.

17. A computing facility comprising:
- a cluster section having a plurality of immersion tanks positioned therein, each of the plurality of immersion tanks having a plurality of computing boards immersed in dielectric liquid within the immersion tank;
- a facilities section having a condenser arrangement and a resupply tank positioned therein, the condenser arrangement including a main condenser and an auxiliary condenser, and the resupply tank configured to receive condensed dielectric liquid from the main condenser and the auxiliary condenser;
- a plurality of vapor passageways, each providing fluid communication between a respective immersion tank and the main condenser of the condenser arrangement without providing fluid communication between the respective immersion tank and the auxiliary condenser; and,
- a containment passageway enclosing the plurality of immersion tanks, the condenser arrangement and the plurality of vapor passageways, the containment passageway providing fluid communication between the plurality of immersion tanks and the auxiliary condenser of the condenser arrangement independent of the plurality of vapor passageways and containing flow of vapor from the plurality of immersion tanks from flowing outside of the containment passageway.

18. The computing facility of claim 17, further comprising a plurality of pumps, each coupled between the resupply tank and a respective immersion tank.

19. The computing facility of claim 18, further comprising a controller coupled to the plurality of pumps and energizing each of the plurality of pumps to deliver dielectric liquid from the resupply tank to each of the immersion tanks.

20. The computing facility of claim 17, wherein the plurality of vapor passageways comprise ducting from a lid of each immersion tank to the condenser arrangement.

* * * * *